United States Patent [19]

Haga et al.

[11] Patent Number: 5,451,900
[45] Date of Patent: Sep. 19, 1995

[54] PULSE WIDTH MODULATION CIRCUIT

[75] Inventors: Hiroyuki Haga, Oota; Satoshi Osuga, Yokohama, both of Japan

[73] Assignee: Kabushiki Kaisha Toshiba, Kawasaki, Japan

[21] Appl. No.: 214,207

[22] Filed: Mar. 17, 1994

[30] Foreign Application Priority Data

Mar. 17, 1993 [JP] Japan .................................. 5-057373
Apr. 30, 1993 [JP] Japan .................................. 5-104007

[51] Int. Cl.$^6$ .............................................. H03F 3/38
[52] U.S. Cl. ........................................ 330/10; 330/251
[58] Field of Search ................... 330/10, 207 A, 251; 332/109, 110, 111

[56] References Cited

U.S. PATENT DOCUMENTS 4,004,246  1/1977  Hamada .
4,293,817  10/1981  DeMichele ...................... 330/10 X
4,531,096  7/1985  Yokoyama .

FOREIGN PATENT DOCUMENTS 0298874  1/1989  European Pat. Off. .
2290091  5/1976  France .
2096850  10/1982  United Kingdom .

Primary Examiner—James B. Mullins
Attorney, Agent, or Firm—Oblon, Spivak, McClelland, Maier & Neustadt

[57] ABSTRACT

To suppress electromagnetic radiation without exerting any harmful influence upon both S/N ratio and dynamic range, a pulse width modulation circuit includes an integrating circuit for integrating an input signal applied to an input terminal with respect to time, a comparing circuit connected to the integrating circuit and having hysteresis characteristics, a feedback circuit for feeding back the output of the comparing circuit to an input of the integrating circuit, and an amplitude modulation circuit, provided in a loop including the integrating circuit and the comparing circuit, for implementing amplitude modulation to modulate a frequency of the output of the comparing circuit. Further, the output of the comparing circuit can be fed-back to the integrating circuit via an amplitude modulation circuit. Alternatively, the amplitude of the output of the integrating circuit is first modulated by the amplitude modulation circuit, before being applied to the comparing circuit. A dither signal is applied to the amplitude modulation circuit or, alternatively, a signal for maintaining frequency of the pulse modulated signal may be applied.

19 Claims, 16 Drawing Sheets

PWM OUTPUT SIGNAL WHEN INPUT TERMINAL IS OPEN

OUTPUT SIGNAL OF INTEGRATING CIRCUIT WHEN INPUT TERMINAL IS OPEN

INPUT SIGNAL

OUTPUT SIGNAL OF INTEGRATING CIRCUIT

OUTPUT SIGNAL AT OUTPUT TERMINAL

DITHER SIGNAL

PWM OUTPUT SIGNAL

OUTPUT SIGNAL OF AMPLITUDE MODULATION CIRCUIT

OUTPUT SIGNAL OF INTEGRATING CIRCUIT

DITHER SIGNAL

OUTPUT SIGNAL OF AMPLITUDE MODULATION CIRCUIT

OUTPUT SIGNAL OF INTEGRATING CIRCUIT

OUTPUT SIGNAL AT OUTPUT TERMINAL

INPUT SIGNAL

DITHER SIGNAL

OUTPUT SIGNAL OF SWITCH CIRCUIT (51)

OUTPUT SIGNAL OF SWITCH CIRCUIT (54)

OUTPUT SIGNAL OF MULTIPLIER CIRCUIT (55)

OUTPUT SIGNAL OF MULTIPLIER CIRCUIT (56)

SUPERIMPOSED SIGNAL

OUTPUT SIGNAL

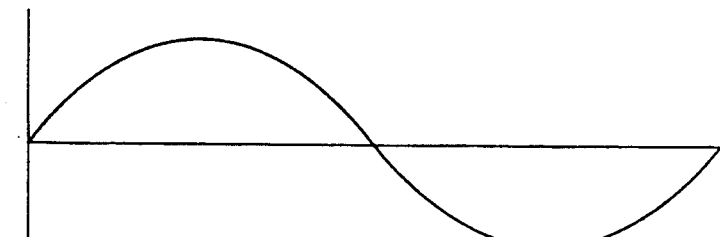
FIG.21A INPUT ANALOG SIGNAL
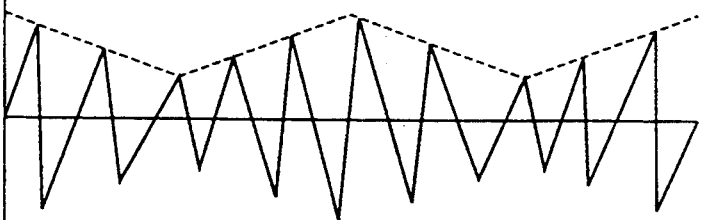
FIG.21B OUTPUT OF INTEGRATING CIRCUIT
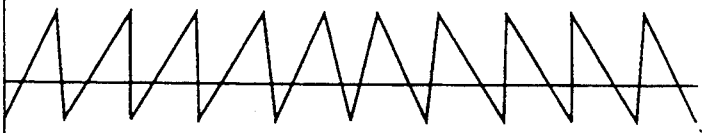
FIG.21C OUTPUT OF MULTIPLIER CIRCUIT
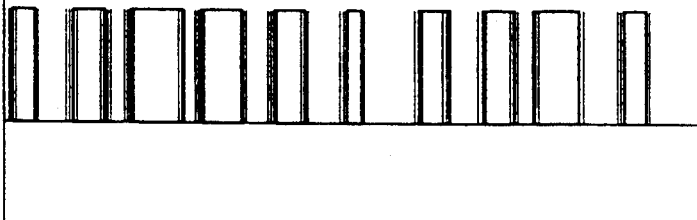
FIG.21D PWM OUTPUT

PULSE WIDTH MODULATION CIRCUIT

BACKGROUND OF THE INVENTION

1. Field of the Invention

The present invention relates to a pulse width modulation (PWM) circuit for controlling a duty factor of an output pulse thereof in response to an amplitude of an analog input signal, and in particular to a pulse width modulation circuit suitable for use to amplify the power of audio signals.

2. Discussion of the Background

A pulse width modulation (PWM) circuit is generally composed of an input terminal for receiving signals to be pulse width modulated, an integrating circuit, the input side thereof being connected to the input terminal, a pulse width modulated wave output terminal, and an output terminal for outputting a pulse modulated signal. The PWM circuit also includes a comparing circuit having a hysteresis characteristic for comparing an input signal with a reference signal applied to a reference input terminal to output the comparison result to the output terminal, and a feedback circuit for feeding back the pulse width modulated wave obtained at a pulse width modulated wave output terminal to the input terminal of the integrating circuit. Under the condition that no input signal is applied to the pulse width modulated wave input terminal, the following monotonous oscillating operation is repeated: a potential change of the integrating circuit (across a capacity) due to current flowing through the feedback circuit is acquired by the comparing circuit, and the direction of the current flowing through the feedback circuit is switched according to the polarity of the output of the comparing circuit. The pulse generated by this oscillation becomes a carrier. Here, when an analog input signal is applied to the pulse width modulated wave input terminal, since the potential change rate of the integrating circuit is subjected to the influence of the input signal amplitude, the polarity inversion time changes at the output of the comparing circuit. In other words, since the duty factor of the outputted pulse signal changes, it is possible to implement the pulse modulation according to the amplitude of the analog input signal.

In addition to the carrier self-oscillating type modulation circuit as described above, there exists another type modulation circuit in which a separate oscillator circuit for outputting a carrier pulse signal is connected to the input terminal of the integrating circuit.

In the conventional pulse width modulation circuit, however, although there exists an advantage in that it is possible to obtain a higher S/N ratio, i.e. a less erroneous operation of the comparing circuit, by increasing the amplitude of the signal outputted by the integration signal output terminal, there exists problems in that the dynamic range thereof is narrowed. Further this conventional circuit is not suitable to reduce the supply voltage of an LSI. This circuit is disadvantageous for high speed operation. Additionally, when the amplitude of the signal developed at the integration signal output terminal is reduced, although it is possible to secure a wide dynamic range and the circuit is suitable to allow reduction of the supply voltage of an LSI, there exists a problem in that it is difficult to secure a high S/N ratio. This tends to cause erroneous operation due to noise. Further, when the amplitude of the signal of the integration signal output terminal is small, that is, when the width of the hysteresis is narrow, there exists a problem in that the comparing circuit is easily operated erroneously due to noise.

Further, in the conventional pulse width modulation circuit, since the output level of the integrating circuit fluctuates according to the level of a dither signal, a problem arises in that the S/N ratio and the dynamic range are both low.

In addition, in the conventional pulse width modulation circuit, there exists another problem in that the components of the fundamental and higher harmonics of the carrier pulse signal are radiated unnecessarily, with the result that this exerts a harmful influence upon a wireless apparatus.

In order to eliminate the unnecessary radiation, it has been necessary to cover a printed circuit board or a whole apparatus. However, this countermeasure causes increase of size and/or cost of the apparatus by incorporating shielding plates made of a metal material.

To overcome the above-mentioned problems, a two-status modulation technique has been disclosed in European Patent Application No. 85303763.8 (Laid-Open No. 0184280A1), in which the width of the hysteresis of the integrating circuit can be changed. In this method, however, there still exists a drawback in that an erroneous operation easily occurs.

SUMMARY OF THE INVENTION

With these problems in mind, therefore, it is an object of the present invention to provide a pulse width modulation circuit in which the electromagnetic radiation can be suppressed effectively in spite of a simple circuit configuration while maintaining a high S/N ratio and a wide dynamic range.

A pulse width modulation circuit according to the present invention comprises: an integrating circuit for integrating an input signal applied to an input terminal with respect to time; a comparing circuit having hysteresis characteristics connected to the integrating circuit; a feedback circuit for feeding back the output of the comparing circuit to an input of the integrating circuit; and an amplitude modulation circuit, provided in a loop including the integrating circuit and the comparing circuit, for implementing amplitude modulation to modulate frequency of the output of the comparing circuit. Further, the output of the comparing circuit can be fed-back to the integrating circuit via an amplitude modulation circuit. Alternatively, the amplitude of the output of the integrating circuit is modulated by the amplitude modulation circuit, before being applied to the comparing circuit.

That is, since the frequency modulation is enabled by implementing the amplitude modulation, it is possible to suppress unnecessary electromagnetic radiation.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 21A-21D are waveform diagrams for explaining the operation of the circuit shown in FIG. 20.

DESCRIPTION OF THE PREFERRED EMBODIMENTS

Figure 1:
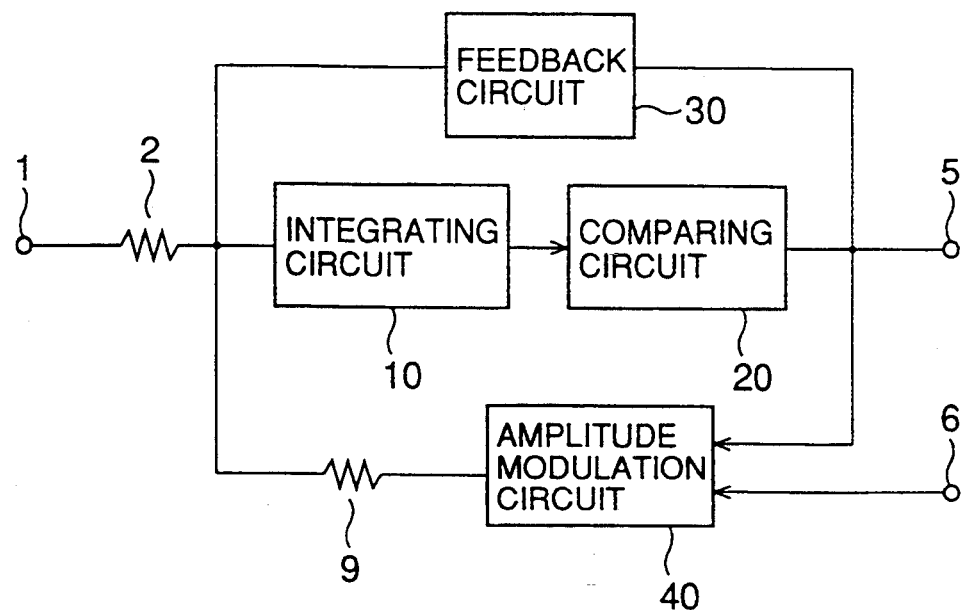
FIG. 1 is a block diagram showing an embodiment of the pulse width modulation circuit according to the present invention.

Referring now to the drawings, wherein like reference numerals designate identical or corresponding parts throughout the several views, and more particularly to FIG. 1 thereof, there is illustrated a block diagram showing an embodiment of the present invention. In the pulse width modulation circuit, an input is signal supplied to an input terminal 1 which is connected to an integrating circuit 10 via an input resistor 2. The output of the integrating circuit 10 is supplied to a comparing circuit 20. The output of the comparing circuit 20 is connected to an output terminal 5 and also fed back to an input side of the integrating circuit 10 via a feedback circuit 30 which may include a resistor. Further, the output of the comparing circuit 20 is supplied to an amplitude modulation circuit 40 together with a dither signal applied through a dither signal input terminal 6. The dither signal may contain a useful oscillation of small amplitude. The output of the amplitude modulation circuit 40 is fed-back to the input side of the integrating-circuit 10 via a feedback resistor 9.

Figure 2:
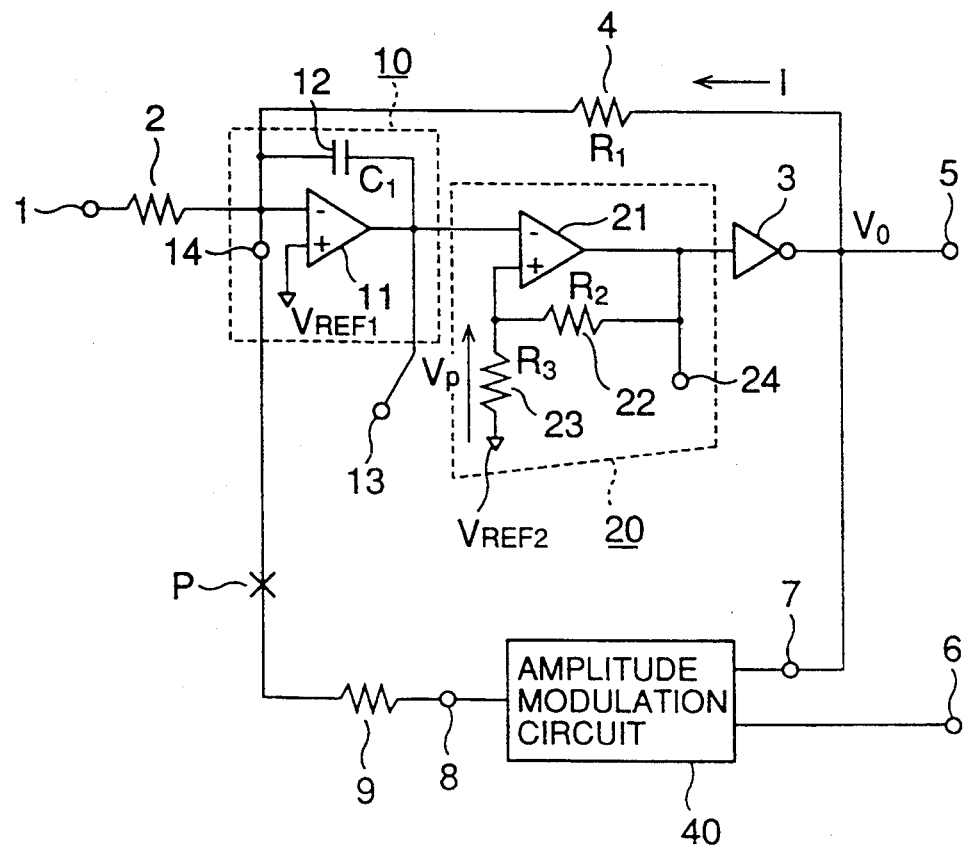
FIG. 2 is a detailed block diagram showing the integrating and comparing circuits of FIG. 1.

FIG. 2 is a more detailed circuit diagram of the circuit shown in FIG. 1. In FIG. 2, one end of the input resistor 2 is connected to the signal input terminal 1. The other end of the input resistor 2 is connected to an inversion input terminal (−) of an operational amplifier 11. This operational amplifier 11 constitutes the integrating circuit 10 together with an integration capacitor 12. One end of the capacitor is connected to the inversion input terminal of the operational amplifier 11, and the other end thereof is connected to the 10 output terminal of the operational amplifier 11. Further, a non-inversion input terminal (+) of the operational amplifier 11 is connected to a voltage supply (not shown) for supplying a reference voltage $V_{ref1}$. The output terminal of the operational amplifier 11 is connected to the integration signal output terminal 13.

The output terminal of the operational amplifier 11 is connected to an inversion input terminal of another operational amplifier 21. This operational amplifier 21 constitutes the comparing circuit 20 together with resistors 22 and 23. One end of the resistor 22 is connected to the output terminal of the operational amplifier 21, and the other end thereof is connected to a non-inversion input terminal of the operational amplifier 21. Further, one end of the resistor 23 is connected to the end of the resistor 22 which is connected to the non-inversion input of the operational amplifier 21, and the other end of the resistor 23 is connected to another voltage supply (not shown) for applying another reference voltage $V_{ref2}$. The output terminal of the operational amplifier 21 is connected to a comparison signal output terminal 24.

The output terminal of the operational amplifier 21 is connected to an input terminal of an inverter 3. The output terminal of this inverter 3 is connected to the inversion input terminal of the operational amplifier 11 via a feedback resistor 4 (which serves as a feedback element of the feedback circuit 30), and is directly connected to a PWM signal output terminal 5 which outputs a signal Vo.

The PWM signal output terminal 5 is connected to one input terminal 7 of the amplitude modulation circuit 40. Further, the other input terminal of this amplitude modulation circuit 40 is a dither input terminal 6. The output terminal of the amplitude modulation circuit 40 is an amplitude modulated signal output terminal 8 to which one end of a resistor 9 is connected. The other end of the resistor 9 is connected to the inversion input terminal of the operational amplifier 11.

The operation of the circuit described above will be described hereinbelow.

To facilitate the understanding of the operation of the circuit, a case where there is a disconnection of the wire connecting resistor 9 to the inversion input of the operational amplifier 11 at point P. The signal input terminal 1 is open (i.e. the voltage at the input floats) and the potential of the PWM signal output terminal 5 is Vo. Further, the reference voltages $V_{ref1}$ and $V_{ref2}$ are assumed to be the ground potential. Under these conditions, the potential of the input terminal of the inverter 3, that is, the potential of the output terminal of the comparing circuit 20 is −Vo. Accordingly, when the resistance of the resistor 22 is R2, and the resistance of the resistor 23 is R3, the potential Vp at the non-inversion input terminal of the operational amplifier 21 can be expressed as:

$$Vp = R3 \times Vo/(R2+R3) \qquad (1)$$

On the other hand, if the resistance of the resistor 4 is R1, the current I flowing through the capacitor 12 can be expressed as:

$$I = Vo/R1 \quad (2)$$

Here, when the current I flows into the capacitor 12, the potential at the output terminal of the operational amplifier 11, that is, the output terminal potential of the integrating circuit 10 drops. When the output terminal potential of the integrating circuit 10 drops below the potential Vp at the non-inversion input terminal of the operational amplifier 21, the output terminal potential of the operational amplifier 21 is inverted to Vo, so that the potential at the PWM signal output terminal 5 is inverted to −Vo. Further, at the same time, the potential Vp at the non-inversion input terminal of the operational amplifier 21 becomes a value as expressed below:

$$Vp = R3 \times Vo/(R2 + R3) \quad (3)$$

As described above, when the output status of the operational amplifier 21 is inverted, the current I flowing through the capacitor 12 can be expressed by the following formula:

$$I = Vo/R1 \quad (4)$$

Accordingly, on the other hand, the output terminal potential of the operational amplifier 11, that is, the output terminal potential of the integrating circuit 10 rises. Further, when the output terminal potential of the integrating circuit 10 reaches the potential Vp of the noninversion input terminal of the operational amplifier 21, the output terminal potential of the operational amplifier 21 is inverted to −Vo, so that the potential of the PWM signal output terminal 5 is also inverted.

Figure 3A:
FIGS. 3A and 3B are waveform diagrams for assisting in the explanation of the operation of the circuit shown in FIG. 2.
Figure 3B:

Therefore, the circuit is oscillated by repeating the above-mentioned operation, with the result that a rectangular pulse signal as shown in FIG. 3A is outputted from the PWM signal output terminal 5, and a triangular waveform signal as shown in FIG. 3B is outputted from the integrated signal output terminal 13.

The oscillation frequency of the basic PWM circuit is determined by the following formula:

$$f = (R2 + R3)/(4 \times C1 \times R1 \times R3) \quad (5)$$

where C1 denotes the electrostatic capacity of the capacitor 12.

Figure 4A:
FIGS. 4A, 4B and 4C are waveform diagrams for explaining the operation of the circuit shown in FIG. 2.
Figure 4B:
Figure 4C:
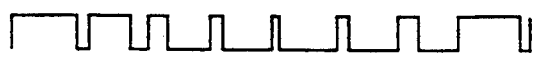

Next, the case when a signal as shown in FIG. 4A is applied to the signal input terminal 1 will be taken into account. This signal changes in level above and below the reference voltage $V_{ref1}$ over time. When the potential at the signal input terminal 1 is lower than the reference voltage $V_{ref1}$, the rise rate of the potential at the integrated signal output terminal 13 is high but the fall rate thereof is low. In contrast with this, when the potential at the signal input terminal 1 is higher than the reference voltage $V_{ref1}$, the rise rate of the potential at the integrated signal output terminal 13 is low but the fall rate thereof is high. Therefore, the potential at the integrated signal output terminal 13 changes as shown in FIG. 4B, and the potential at the PWM signal output terminal 5 changes as shown in FIG. 4C. The signal outputted from the PWM signal output terminal 5 is a PWM wave.

Figure 5A:
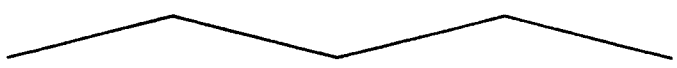
FIGS. 5A-5D are waveform diagrams for assisting in the explanation of operation of the amplitude modulation circuit shown in FIG. 2.
Figure 5B:
Figure 5C:
Figure 5D:

An explanation of the amplitude modulation circuit 40 will now be given. When a rectangular pulse signal as shown in FIG. 5B is developed at the PWM signal output terminal 5, this rectangular pulse signal is applied to the amplitude modulation circuit 40 via the pulse signal input terminal 7. When a signal as shown in FIG. 5A is applied to the dither signal input terminal 6 of the amplitude modulation circuit 40, since the amplitude of the rectangular pulse signal is modulated by the dither signal, it is possible to obtain a signal as shown in FIG. 5C at the output of the amplitude modulation circuit 40 (terminal 8). In this case, a signal as shown in FIG. 5D develops at the integrated signal output terminal 13.

Figure 6A:
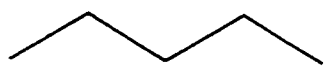
FIGS. 6A-6D are waveform diagrams for explaining the overall operation of the circuit shown in FIG. 2.
Figure 6B:
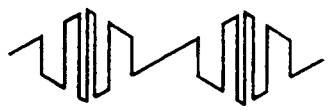
Figure 6C:
Figure 6D:

Next, an explanation will be given using FIGS. 6A–6D when the amplitude modulation circuit 40 is connected to the inversion input of the operation amplifier 11 through resistor 9 (i.e., there is no disconnection at the point P in FIG. 2). In this case, since the amplitude of the signal developing at the PWM signal output terminal 5 is modulated on the basis of the dither signal as shown in FIG. 6A, a signal as shown in FIG. 6B develops at the amplitude modulated signal output terminal 8. This signal is applied to the inversion input terminal of the operational amplifier 11 via the resistor 9. In this operation, when the amplitude modulated signal level is positive, the fall rate of the output voltage wave of the integrating circuit 10 increases with increasing amplitude of the amplitude modulated signal. In contrast to this, when the amplitude modulated signal level is negative, the rise rate of the output voltage wave of the integrating circuit 10 increases with increasing amplitude of the amplitude modulated signal. In other words, the output signal frequency of the integrating circuit 10 changes in proportion to the amplitude of the dither signal, thus realizing frequency modulation. Therefore, when the signal as shown in FIG. 6B is applied to the integrating circuit 10, a signal as shown in FIG. 6C develops at the integrating circuit output terminal 13. As a result, a PWM signal as shown in FIG. 6D develops at the PWM signal output terminal 5. Therefore, the amplitude modulation circuit 40 modulates the amplitude of the signal as shown in FIG. 6D on the basis of the dither signal as shown in FIG. 6A, and outputs the modulated signal as shown in FIG. 6B.

As a result, it is possible to disperse the frequency spectra of the PWM signal by keeping the amplitude of the output signal of the integrating circuit 10 at a constant level.

Figure 7:
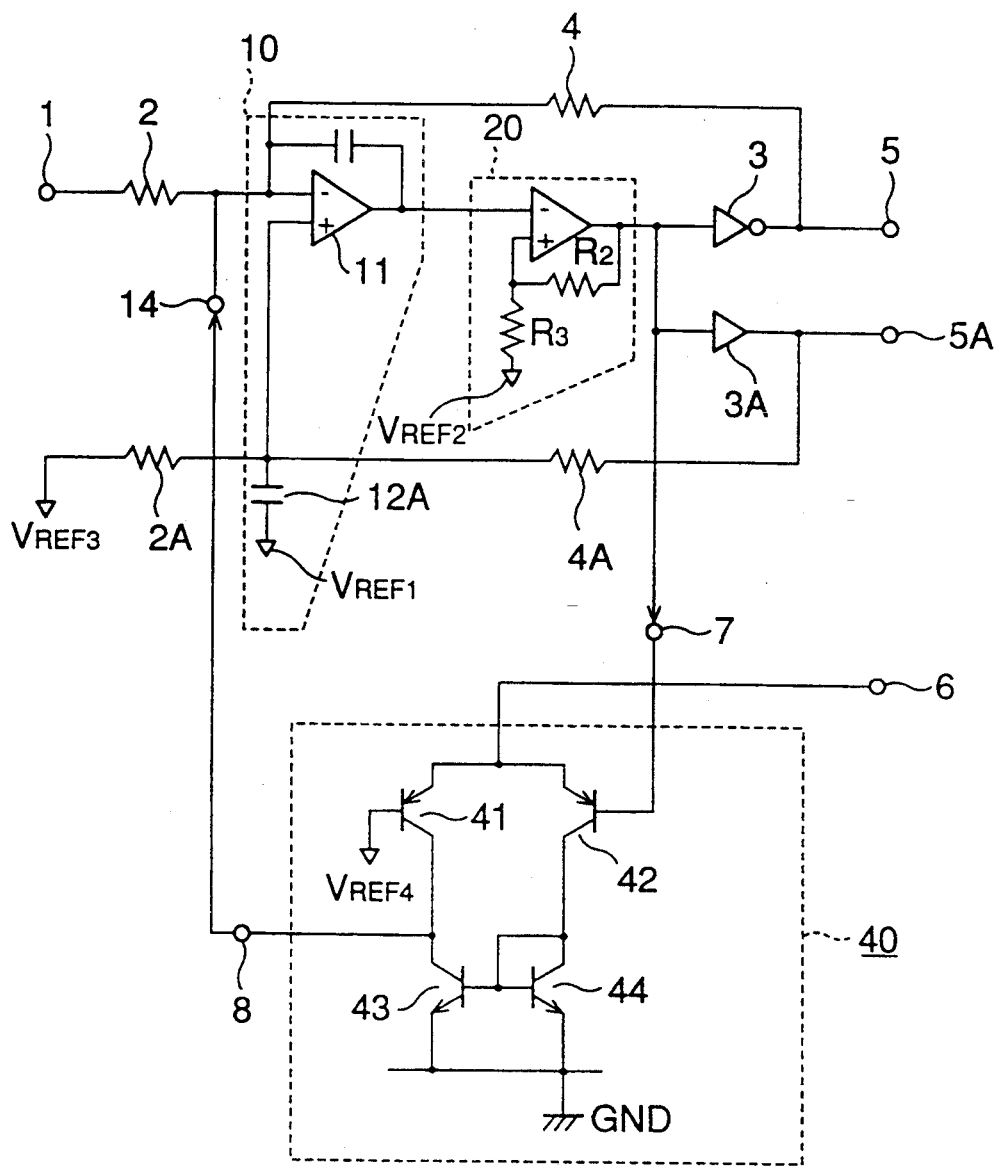
FIG. 7 is a circuit diagram showing another embodiment of the present invention.

FIG. 7 shows another embodiment of the present invention, in which the same elements as the elements in the embodiment shown in FIGS. 1 and 2 are designated by the same reference numerals. In this embodiment, an input terminal of a buffer 3A is connected to the output terminal of the comparing circuit 20, and an output terminal of the buffer 3A is connected to the PWM signal output terminal 5A. Further, one end of a resistor 4A is connected to a PWM signal output terminal 5A, and the other end thereof is connected to the non-inversion input terminal of the operational amplifier 11. One end of a capacitor 12A is connected to the other end of the resistor 4A, and the other end of the capacitor 12A is connected to a voltage supply (not shown) for applying a reference voltage $V_{ref1}$. Furthermore, one end of a resistor 2A is connected to the other end of the resistor 4A, and the other end of resistor 2A is connected to a voltage supply (not shown) for applying a reference voltage $V_{ref3}$. In this embodiment, the amplitude modulation circuit 40 is composed of PNP transistors 41 and 42 and NPN transistors 43 and 44. Here, the emitters of the transistors 41 and 42 are connected to each other and further connected to the dither signal input terminal 6 of a current input type. Further, a voltage supply (not shown) for applying a reference voltage $V_{ref}$ is connected to the base of the transistor 41, and the base of the transistor 42 is a pulse signal input terminal 7. This input terminal 7 is connected to the output of the comparing circuit 20 which is converted through an inverter to the PWM output terminal 5. On the other hand, the collector of the transistor 44 is connected to the collector of the transistor 42. Further, the bases of the transistors 43 and 44 are connected to each other, and further connected to the collector of the transistor 44. The emitters of the transistors 43 and 44 are connected in common to a ground point GND. Also, the collector of the transistor 43 is the amplitude modulated signal output terminal 8 which is connected to the inversion input terminal 14 of the integrating circuit 10.

In this amplitude modulation circuit, a differential amplifier circuit is composed of the transistors 41 and 42. Further, the amplitude of the current flowing through the transistor 42 is modulated by passing a roughly constant current through the transistor 41 and further by passing a dither signal current from the dither signal input terminal 6. The transistors 43 and 44 constitute an active load circuit. The collector current of the transistor 43 having a high output impedance is changed according to the amplitude modulated signal. Further, since the collector current of the transistor 43 thus obtained is passed through the inversion input terminal of the operational amplifier 11, it is possible to superpose the amplitude modulated signal upon the input signal. In this embodiment, since the value of current flowing through the inversion input terminal of the operational amplifier 11 can be determined appropriately inside the amplitude modulation circuit 40, it is possible to eliminate the resistor 9 shown in FIGS. 1 and 2.

The operation of the circuit illustrated in FIG. 7 will be described hereinbelow. In this circuit, a PWM signal opposite in polarity to that at the PWM signal output terminal can be outputted from the PWM signal output terminal 5A. The signal generated at the PWM signal output terminal 5A is fed back to the non-inversion input terminal of the operational amplifier 11 via a CR circuit composed of two resistors 2A and 4A and a capacitor 12A. In this circuit composed as described above, it is possible to implement a BTL (balanced transformless) negative feedback between the integrating circuit 10 and the comparing circuit 20.

As a result of use of the BTL negative feedback loop, it is possible to increase the output voltage on the basis of the same supply voltage and further to reduce the power consumption.

On the other hand, in the above-mentioned embodiments, the output signal level of the amplitude modulated signal must be determined appropriately under due consideration of the level of the input signal applied to the signal input terminal 1. Here, even if the output signal level of the amplitude modulation circuit is kept at a constant level, when the input signal level drops below an ordinary level, there exists the case where the output signal level of the amplitude modulation circuit increases greatly beyond the input signal level.

When the output signal level of the amplitude modulation circuit becomes higher than the input signal level, the components of the signal applied to the signal input terminal 1 are few but the components of the output signal of the amplitude modulation circuit are many. As a result, since the input signal components are masked by the output signal components of the amplitude modulation circuit, there exists a possibility that only the output signal components of the amplitude modulation circuit are developed in the PWM signal at the signal output terminal 5.

Figure 8:
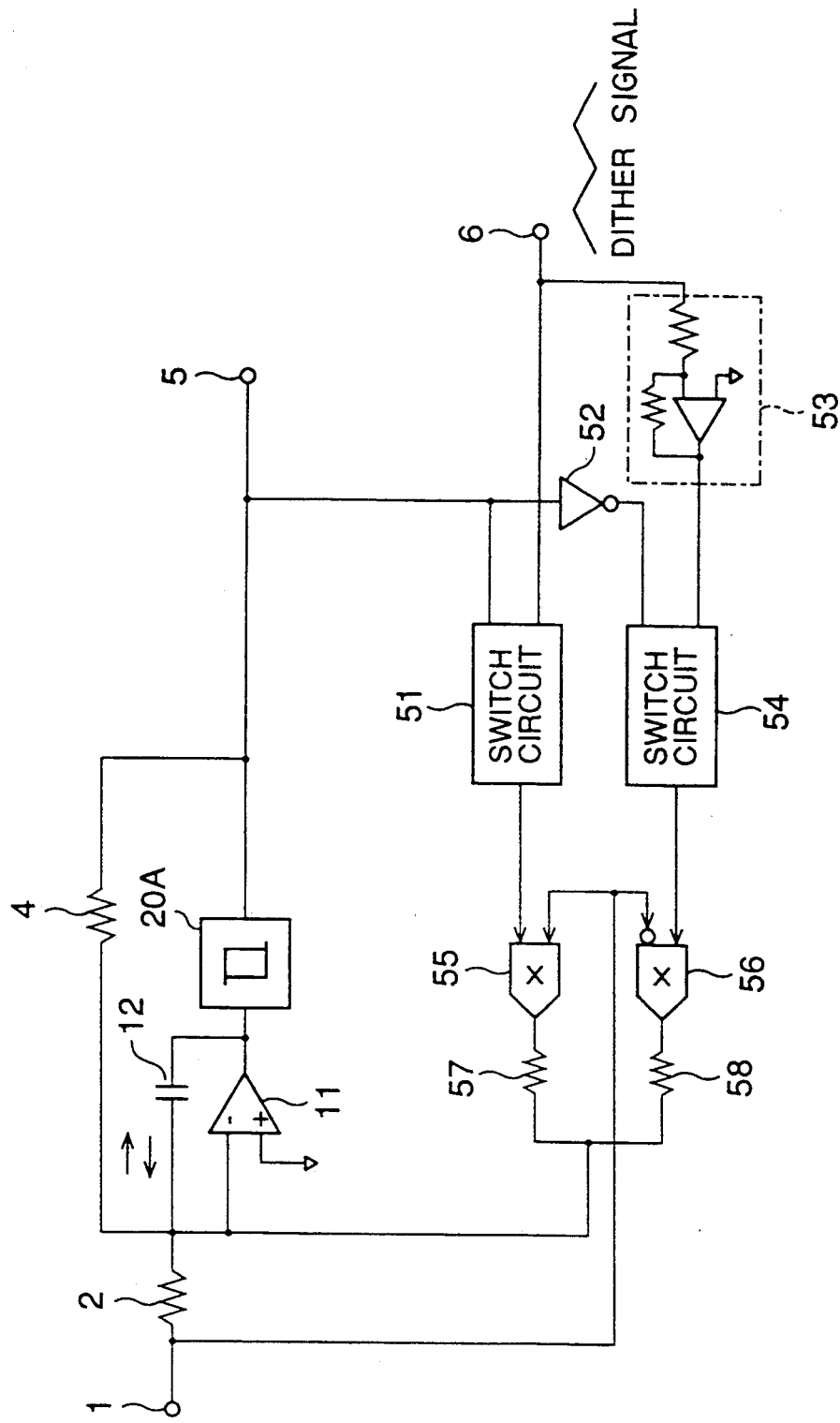
FIG. 8 is a block diagram showing still another embodiment of the present invention.

FIG. 8 is a block diagram showing still another embodiment of the present invention, which can prevent the above-mentioned problem. In FIG. 8, the same elements as which are shown in FIGS. 2 and 7 are designated by the same reference numerals. In this embodiment, the PWM signal developed at the signal output terminal 5 is supplied to one input terminal of a switch circuit 51, and the dither signal applied to the dither signal input terminal 6 is supplied to the other input terminal of the same switch circuit 51. Further, the PWM signal developed at the signal output terminal 5 and inverted by an inverter 52 is applied to one input terminal of another switch circuit 54, and the dither signal applied to the dither signal input terminal 6 and inverted by an inverting amplifier 53 is supplied to the other input terminal of the switch circuit 54. The switch circuit is generally composed of differential amplifiers.

Further, the output signal of the switch circuit 51 is supplied to one input terminal of a multiplier 55, and the input signal applied to the signal input terminal 1 is supplied to the other input terminal of the multiplier 55. Both the supplied signals are multiplied by the multiplier 55. Further, the output signal of the switch circuit 54 is supplied to one input terminal of another multiplier 56, and the input signal applied to the signal input terminal 1 is supplied to the other input terminal of the multiplier 56. Both the supplied signals are multiplied by the multiplier 56. The output signals of these multipliers 55 and 56 are superposed upon the input signal via two resistors 57 and 58, respectively.

The operation of this embodiment will be described hereinbelow with reference to FIGS. 9A to 9H. First, the assumption is made that a point between the resistors 57 and 58 and the inversion input terminal of the operational amplifier 11 is disconnected from each other so as not to apply the dither signal components. When the signal level at the signal input terminal 1 is increased gradually as shown by a solid line in FIG. 9A, a PWM signal whose pulse width is narrowed gradually as shown in FIG. 9H is developed at the signal output terminal 5.

Figure 9A:
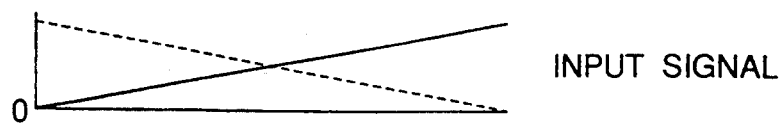
FIGS. 9A-9H are waveform diagrams for explaining the operation of the circuit shown in FIG. 8.
Figure 9B:
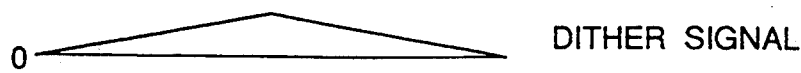
Figure 9C:
Figure 9D:
Figure 9E:
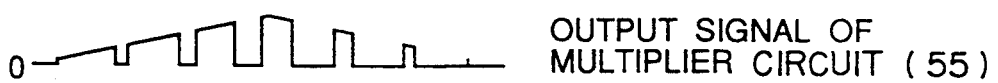
Figure 9F:
Figure 9G:
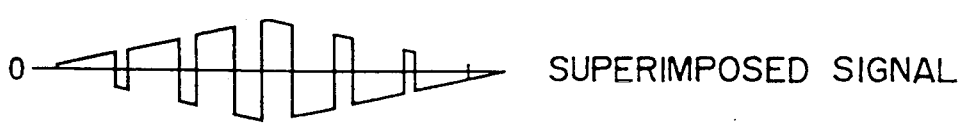
Figure 9H:
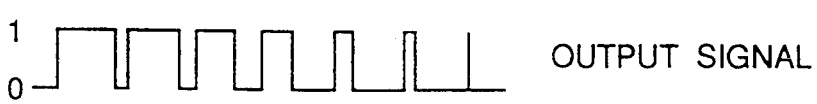

Further, when the PWM signal as shown in FIG. 9H and the dither signal applied to the dither signal input terminal 6 as shown in FIG. 9B are supplied to the comparator 51, it is possible to output the signal as shown in FIG. 9C in which the positive level of the PWM signal is limited on the basis of the dither signal. On the other hand, the inversion amplifier 53 inverts the level of the input signal relative to the reference signal and outputs the inverted signal. The inverter 52 inverts the polarity of the PWM signal and outputs the inverted PWM signal. Therefore, when these inverted signals are applied to the switch circuit 54, it is possible to output the signal as shown in FIG. 9D, in which the portions corresponding to "1" of the PWM signal are at the "0" level and the portions corresponding to "0" of the PWM signal are at the negative levels limited on the basis of the level of the dither signal. From FIGS. 9B–9D and 9H, the functions performed by the switch circuits 51 and 54 can be seen.

The multiplier 55 multiplies the signal as shown in FIG. 9C by the signal as shown in FIG. 9A, and outputs the signal as shown in FIG. 9E. Further, the multiplier 56 multiplies the signal as shown in FIG. 9D by the signal as shown in FIG. 9A, and outputs the signal as shown in FIG. 9F.

Here, when the point between the resistors 57 and 58 and the inversion input terminal of the operational amplifier 11 (previously described as being disconnected) is connected again, the signals outputted by the multipliers 55 and 56 are synthesized by the resistors 57 and 57 respectively, so that the current signal as shown in FIG. 9G can be obtained and applied to the inversion input terminal of the operational amplifier 11.

Further, when the current signal as shown in FIG. 9G is applied to the inversion input terminal of the operational amplifier 11, although the signal waveforms as shown in FIGS. 9A to 9C also change, the description thereof is omitted for brevity.

Here, the signal to be superposed upon the input signal (as shown in FIG. 9G) corresponds to the signal as shown in FIG. 5C. However, the difference between both is as follows: the level of the envelope of the signal shown in FIG. 9G is proportional to the signal level at the signal input terminal 1, but the level of the envelope of the signal shown in FIG. 5C is not subjected to the influence of the signal level at the signal input terminal 1.

As described above, in the embodiment shown in FIG. 8, it is possible to prevent the output signal level of the amplitude modulation circuit from being increased largely beyond the input signal level, so that there exists such effects that the radiation can be suppressed and the erroneous operation of the comparing circuit due to noise can be prevented.

Figure 10:
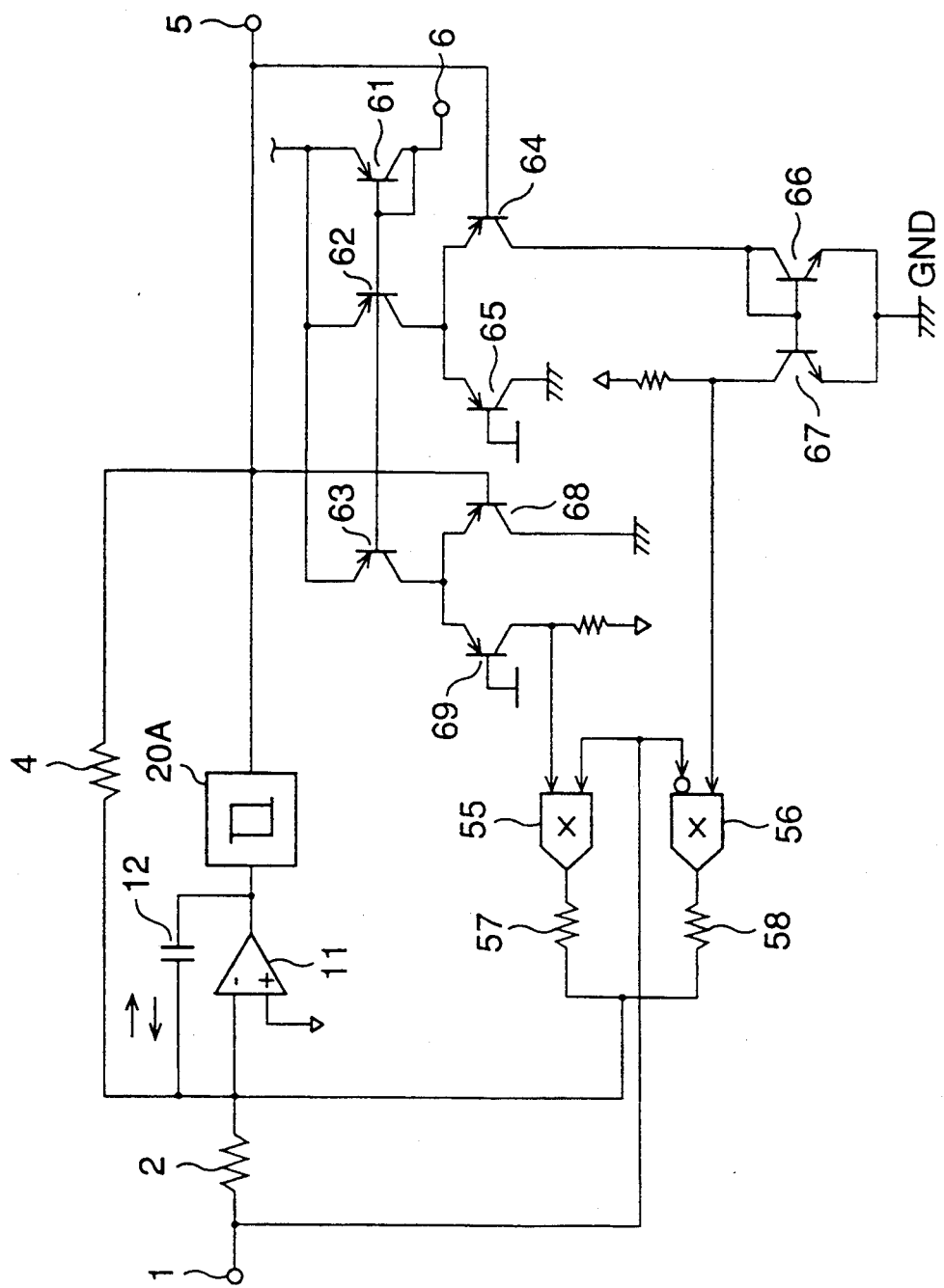
FIG. 10 is a circuit diagram showing a practical circuit configuration of the embodiment shown in FIG. 8.

FIG. 10 is a circuit diagram showing a practical circuit configuration of the embodiment shown in FIG. 8. In the drawing, transistors 61 to 65, 68 and 69 are PNP transistors and the transistors 66 and 67 are NPN transistors. The respective emitters of the transistors 61 to 63 are connected in common to a positive reference voltage supply (not shown). Further, the collector of the transistor 61 is connected to the dither signal input terminal 6, and the respective bases of the transistors 61 to 63 are connected in common to the collector of the transistor 61.

The respective emitters of the transistors 64 and 65 are connected to the collector of the transistor 62; the base of the transistor 64 is connected to a signal output terminal 5; the base of the transistor 65 is connected to a voltage supply for generating an intermediate voltage of the reference voltage; and the collector of the transistor 65 is connected to ground.

The respective emitters of the transistors 66 and 67 are connected to the ground; and the respective bases of these transistors 66 and 67 are connected in common to the collector of the transistor 64 together with the collector of the transistor 66. Further, the collector of the transistor 67 is connected to the reference voltage supply via a resistor and to an input terminal of the multiplier 56.

The respective emitters of the transistors 68 and 69 are connected in common to the collector of the transistor 63; the base of the transistor 68 is connected to the signal output terminal 5; the collector of the same transistor 68 is connected to the ground; the base of the transistor 69 is connected to the voltage supply for generating an intermediate voltage of the reference voltage; and the collector of the transistor 69 is connected to the reference voltage supply via a resistor and is also connected to an input terminal of the multiplier 55.

In FIG. 10, the transistors 61 to 63 constitute a current mirror circuit. When a dither signal is applied to the dither signal input terminal 6, the same amount of current that flows through transistor 61 flows through the transistors 62 and 63. The transistors 68 and 69 constitute a differential amplifier circuit. When the current flowing through the transistor 63 is supplied to the differential amplifier circuit and a PWM signal which is at the signal output terminal 5 is applied to the base of the transistor 68, it is possible to obtain an amplitude modulated signal as shown in FIG. 9C from the collector of the transistor 69. In the same way, the transistors 64 and 65 constitute another differential amplifier circuit. When the current flowing through the transistor 62 is supplied to this differential amplifier circuit and the PWM signal which is at the signal output terminal 5 is applied to the base of the transistor 64, it is possible to obtain a PWM signal whose level is inverted. The transistors 66 and 67 constitute an inversion amplifier circuit. When this PWM signal is applied is to the collector of the transistor 66 connected to the respective bases of the transistors 66 and 67, it is possible to obtain an amplitude modulated signal as shown in FIG. 9D.

The amplitude modulated signal obtained from the collector of the transistor 69 is multiplied by the input signal through the multiplier 55, and the amplitude modulated signal obtained from the collector of the transistor 67 is multiplied by the inverted input signal through the multiplier 56.

As described above, it is possible to operate the circuit shown in FIG. 10 in the same way as with the case of the circuit illustrated in FIG. 8.

In the above-mentioned embodiments, although the PWM signal outputted by the comparators or the differential amplifiers is amplitude-modulated on the basis of the dither signal as it is, it is of course possible to use a signal whose frequency is proportional to that of the PWM signal outputted by the comparing circuit. Further, it is also possible to disperse the frequency spectra in quite the same way as above, by using a pulse signal whose frequency is equivalent thereto, without using the PWM signal outputted by the comparing circuit.

Further, in the above-mentioned embodiments, although the comparing circuit of voltage comparison type is adopted, it is of course possible to alternatively use a current comparison type comparing circuit.

Additionally, instead of the voltage comparing circuit, it is also possible to obtain the same function as above by use of an amplifier.

In the above-mentioned respective embodiments, although the operation thereof has been explained on the assumption that the PWM signal can be outputted from the PWM signal output terminal 5, it is apparent that the present invention can be applied when a frequency modulated signal corresponding to the input signal is required to be generated from the integration signal output terminal.

As described above, according to the embodiments shown in FIGS. 1 to 10, since it is possible to disperse the frequency spectra of the PWM signal by implementing the frequency modulation while keeping the amplitude of the output signal of the integrating circuit at a constant level, it is possible to suppress the radiation without exerting harmful influence upon both the S/N ratio and the dynamic range thereof. In addition, it is possible to prevent erroneous operation of the comparing circuit, which tends to occur due to noise when the amplitude of the integrating circuit is small. Further, it is also possible to simplify the circuit configuration, when the signal proportional to the output signal of the comparing circuit is used as the amplitude modulated signal.

Examples of other application of the circuit according to the present invention shown in FIG. 1 will be described hereinbelow.

The pulse width modulation (PWM) circuit is widely used to drive a low impedance load such as an acoustic speaker, a motor, etc. Therefore, in the power driver circuit having a sufficient load driving capacity, it is necessary to amplify the power of the PWM signal. In this case, when power MOSFET elements, for instance, are used for the power driver circuit, there exists a problem in that the distortion factor of the audio signal is deteriorated due to the characteristics of the elements themselves (lower rise and fall rates).

Figure 11:
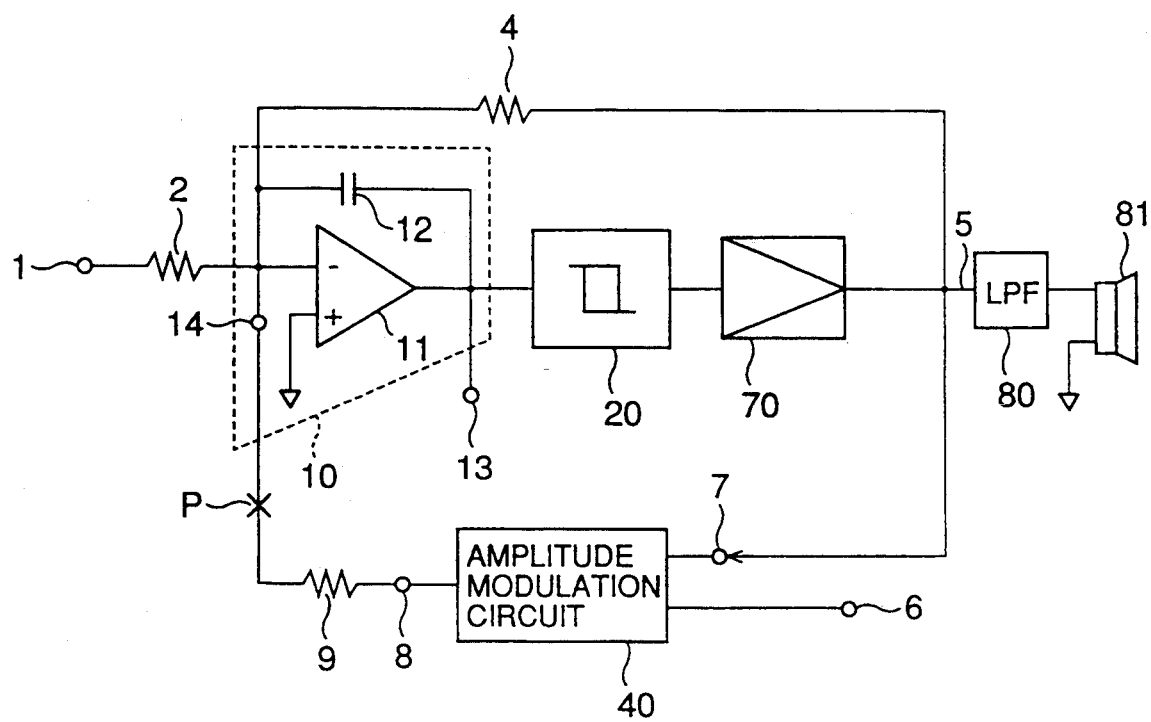
FIG. 11 is a block diagram showing an example to which the embodiment shown in FIG. 2 is applied to drive a light load.

FIG. 11 is a circuit based upon the circuit shown in FIG. 2. This circuit shown in FIG. 11 is the same in configuration as the circuit shown in FIG. 2, except that a power driver circuit 70 is interposed between the comparing circuit 20 and the signal output terminal 5. Also, a low-pass filter 80 and a speaker 81 are connected to the signal output terminal 5 to remove the signal components other than the audio frequency range. Since the power driver circuit 70 is interposed in the signal loop of the pulse width modulation circuit, it is possible to prevent the distortion factor of the audio signal from being deteriorated due to the distortion of the power driver circuit.

Figure 12:
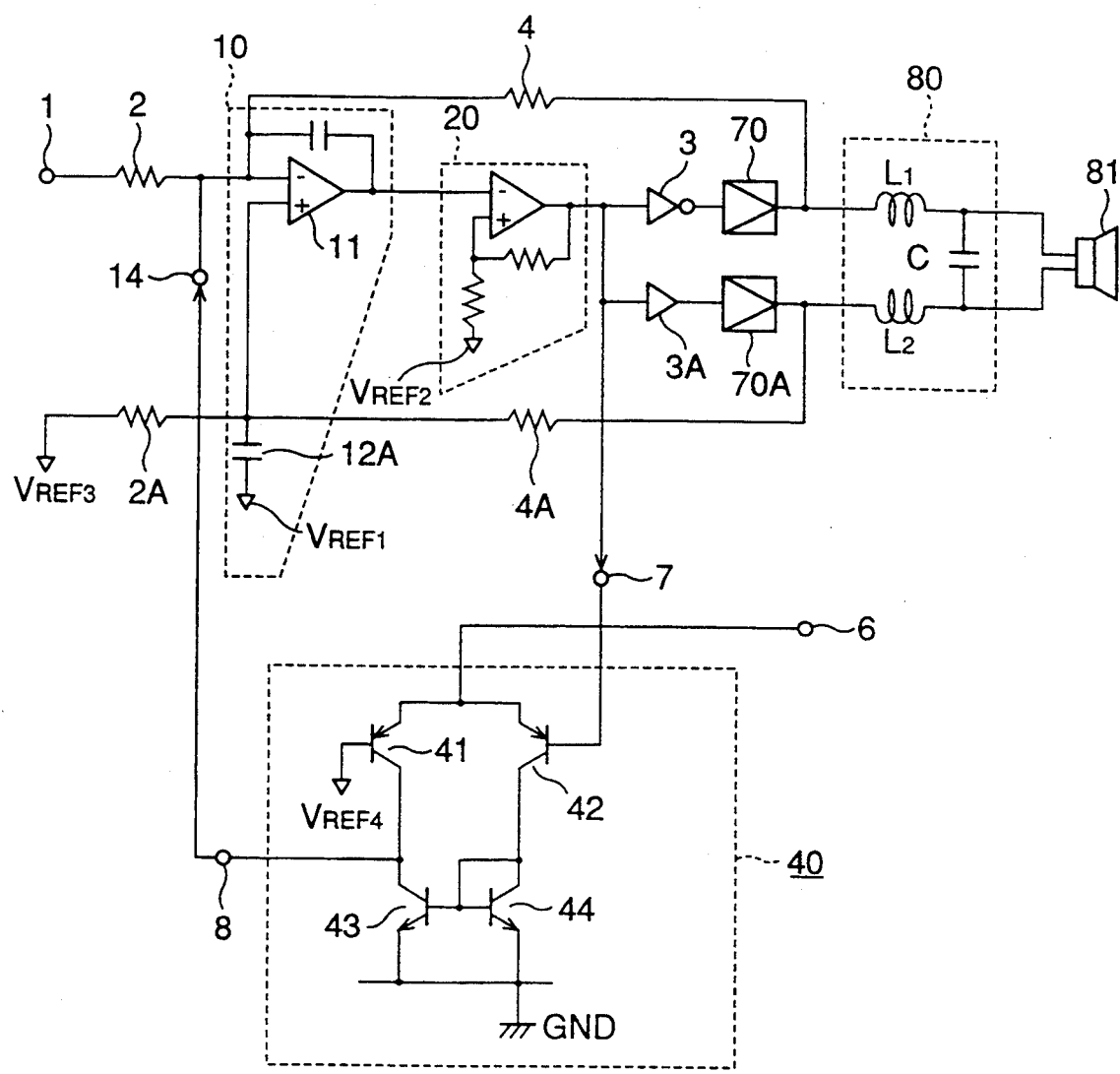
FIG. 12 is a block diagram showing another example to which the embodiment shown in FIG. 7 is applied to drive a light load.

FIG. 12 is a circuit showing another application example in which a power driver circuit is incorporated in the circuit shown in FIG. 7. The differences between this circuit and the circuit shown in FIG. 7 is that a power driver circuit 70 is connected to the inverter 3; a power driver circuit 70A is connected to the buffer 3A; and coils L1 and L2 of a low-pass filter 80 are connected to the respective signal output terminals.

Figure 13:
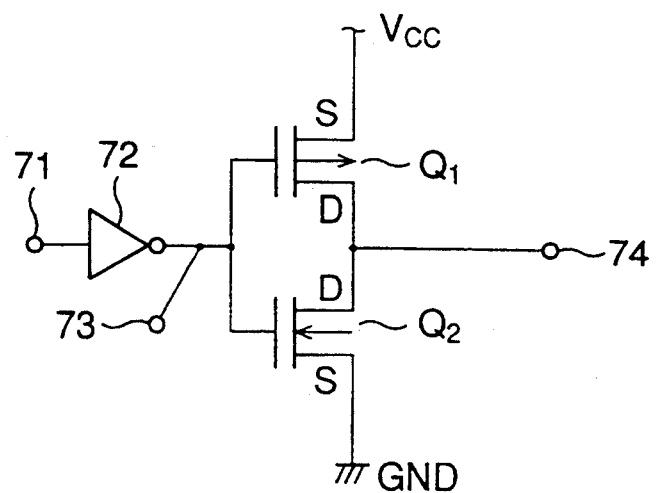
FIG. 13 is a circuit diagram showing an example of a power driver circuit.

FIG. 13 is a circuit showing one example of the power driver circuit. In FIG. 13, an output terminal 73 of an inversion pre-driver circuit 72 (connected to an input terminal 71) is connected to a common gate junction point of a P-channel power MOSFET Q1 and an N-channel power MOSFET Q2. Further, a common drain junction point of the MOSFETs Q1 and Q2 is an output terminal 74.

In this circuit, when the input terminal 71 is at an L-level, the output terminal 73 of the inversion pre-driver circuit 72 is at an H-level and the gates of both the power MOSFETs are at the H-level. Under these conditions, the transistor Q1 is turned off and the transistor Q2 is turned on. This causes the output terminal 74 to be connected to a ground GND via a resistance (nearly zero Ω) between the drain and the source of the transistor Q2, and the resistance between the drain and the source of the transistor Q1 is nearly infinite. On the other hand, when the input terminal 71 is at the H-level, the output terminal 73 of the inversion predriver circuit 72 is at the L-level and the gates of both the power MOSFETs are at the L-level, so that the transistor Q1 is turned on and the transistor Q2 is turned off. Under these conditions, the output terminal 74 is connected to a supply voltage Vcc via a resistance (nearly zero Ω) between the drain and the source of the transistor Q1, and the resistance between the drain and the source of the transistor Q2 is nearly infinite.

As described above, in the power driver circuit shown in FIG. 13, when the input terminal 71 is at the L-level, the output terminal 74 is also at the L-level. When the input terminal 71 is at the H-level, the output terminal 74 is also at the H-level. These conditions make it possible to supply drive current to a load (e.g., a speaker) connected to the output terminal 74. Further, the reason why the inversion pre-driver circuit is incorporated is to obtain the same input and output polarity as that of the power driver circuits shown in FIGS. 11 and 12.

Figure 14:
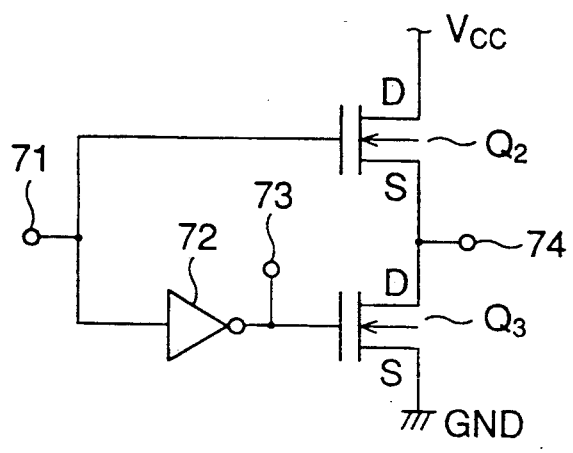
FIG. 14 is a circuit diagram showing another example of the power driver circuit.

FIG. 14 is another example of the power driver circuit in which two N-channel power MOSFETs are used. The input terminal 71 is connected to the gate of an N-channel power MOSFET Q2 and the input terminal of an inversion predriver circuit 72. The output terminal 73 of the inversion predriver circuit 72 is connected to the gate of the N-channel power MOSFET Q3. A common junction point of the source of the transistor Q2 and the drain of the transistor Q3 is the output terminal 74. The drain of the transistor Q2 is connected to a supply voltage Vcc, and the source of the transistor Q3 is grounded.

In this circuit, when the input terminal 71 is at the H-level, since the output terminal 73 of the inversion pre-driver circuit 72 is at the L-level, the gate of the transistor Q3 is also at the L-level, thus turning off transistor Q3. Under these conditions, since the gate of the transistor Q2 is at the H-level, this transistor Q2 is turned on. Accordingly, the output terminal 74 is connected to the supply voltage Vcc via the resistance (nearly zero Ω) between the drain and the source of the transistor Q2. on the other hand, the resistance between the drain and the source of the turned-off transistor Q3 is nearly infinite.

When the input terminal 71 is at the L-level, since the output terminal 73 of the inversion pre-driver circuit 72 is at the H-level, the gate of the transistor Q3 is also at the H-level, so that this transistor Q3 is turned on. Under these conditions, since the gate of the transistor Q2 is at the L-level, this transistor Q2 is turned off. Accordingly, the output terminal 74 is connected to the ground via the resistance (nearly zero Ω) between the drain and the source of the transistor Q3. On the other hand, the resistance between the drain and the source of the turned-off transistor Q2 is nearly infinite.

As described above, in the power driver circuit shown in FIG. 14, when the input terminal is at the L-level, since the output terminal is also at the L-level; and when the input terminal at the H-level, since the output terminal is also at the H-level, it is possible to supply drive current to a load (e.g., a speaker) connected to the output terminal 74.

Another embodiment in which the dither input as shown in FIG. 1 is used for a different use will be described hereinbelow.

In the embodiments already explained, the signal applied to the dither signal input terminal is triangular in waveform, as shown in FIG. 6A. A low frequency triangular dither signal of about 20 Hz is used to obtain the PWM signal whose frequency is modulated on the basis of the triangular signal at the PWM output terminal for radiation prevention. In this embodiment, the dither signal is used to correct the frequency of the PWM signal, which is different from the use of the dither signal to prevent radiation.

In the circuit shown in FIG. 2, when the amplitude modulation circuit 40 does not exist and there is no feedback loop related thereto, there is a shortcoming in that the larger the amplitude of the input signal applied to the signal input terminal 1, the lower the frequency of the output signal of the PWM circuit.

Figure 15:
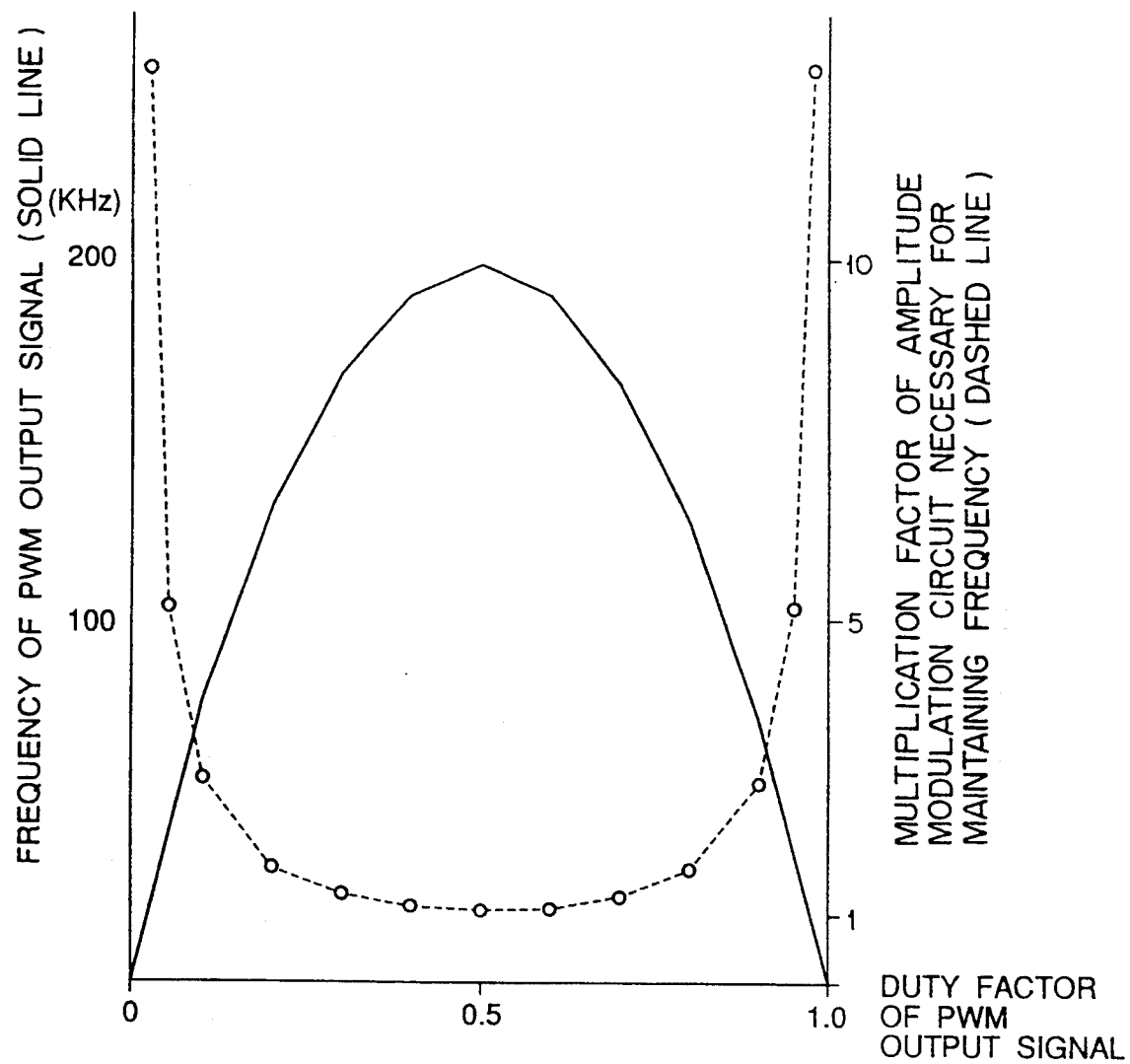
FIG. 15 is a graphical representation for assisting in the explanation of the duty factor.

As shown by the solid curve in FIG. 15, the frequency of the output signal (pulse wave) of the PWM circuit has a maximum value (200 KHz in this embodiment) when the duty factor thereof is 0.5 which corresponds to the case where no input signal is applied to the input terminal. The closer the duty factor of the output signal of the PWM circuit is toward zero or 1.0, the lower the frequency of the output signal of the PWM circuit will be.

Figure 16:
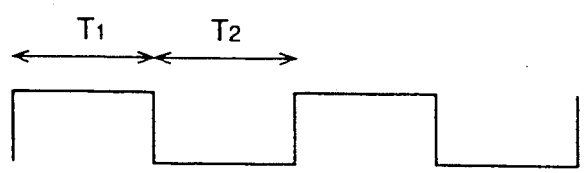
FIG. 16 is an illustration for explaining the definition of the duty factor.

For the pulse signal illustrated in FIG. 16, the duty factor can be expressed as:

$$T1/(T1+T2) \quad (6)$$

where T1 denotes an H-level duration and T2 denotes an L-level duration of the PWM output signal. Further, the oscillation frequency thereof can be expressed as $$f = 4 \times (T1/(T1+T2)) \times (1 - T1/(T1+T2)) \times 200 \ kHz \quad (7)$$

In the circuit shown in FIG. 2, it is possible to cancel or correct the frequency drop of the output signal of the PWM circuit by applying a correcting signal which corresponds to a multiplication factor (which relates to inclination of a triangle wave) of the amplitude modulation circuit in response to the duty ratio of the PWM output signal, i.e. amplitude of the input signal at the signal input terminal.

Figure 17:
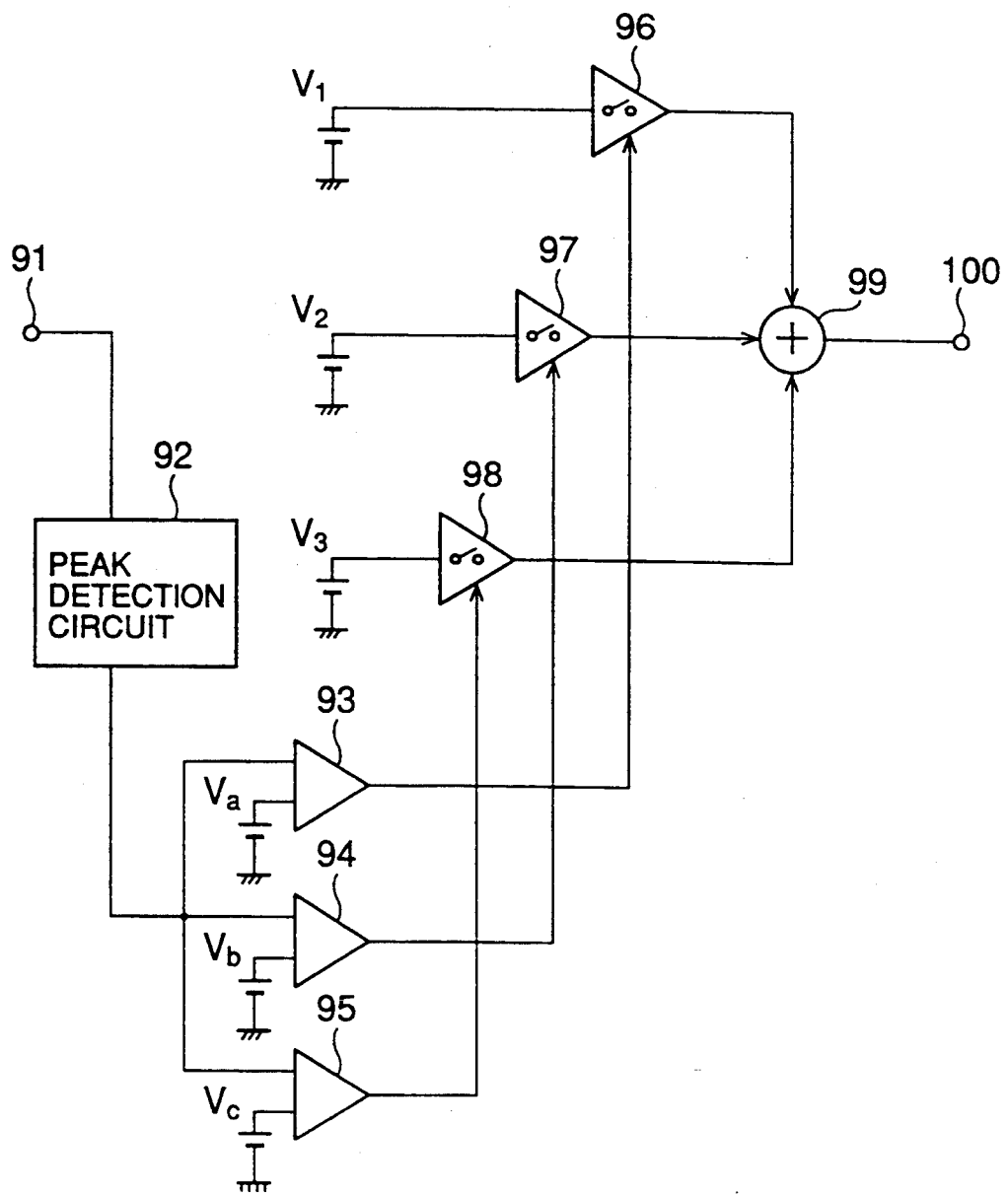
FIG. 17 is a circuit diagram showing a circuit for obtaining a correcting signal.

FIG. 17 is a circuit for obtaining the correcting signal. In this circuit, when a signal similar to the input signal applied to the signal input terminal shown in FIG. 2 is applied to an input terminal 91 of the correcting circuit, the amplitude of the in,put signal is detected by a peak detecting circuit 92. The output of the peak detecting circuit 92 is given to three comparators 93 to 95, respectively. Three different threshold voltages Va, Vb and Vc are supplied as the respective comparison inputs of the comparators 93 to 95. On the basis of the comparison results of these comparators, switching amplifiers 96, 97 and 99 are controlled according to the amplitude. The outputs of the switching amplifiers are added by an adder circuit 99 and the added result is outputted to an output terminal 100 of the correcting circuit. For instance, when the amplitude is small, the switching amplifiers are all turned off. When the amplitude increases, the switching amplifiers 96, 97 and 98 are turned on in sequence with increasing amplitude. Therefore, when the input voltages V1, V2 and V3 of these switching amplifiers are selected appropriately, it is possible to generate the signal having a multiplication factor as shown by the dashed curve in FIG. 15 from the output terminal of the correcting circuit.

Figure 18:
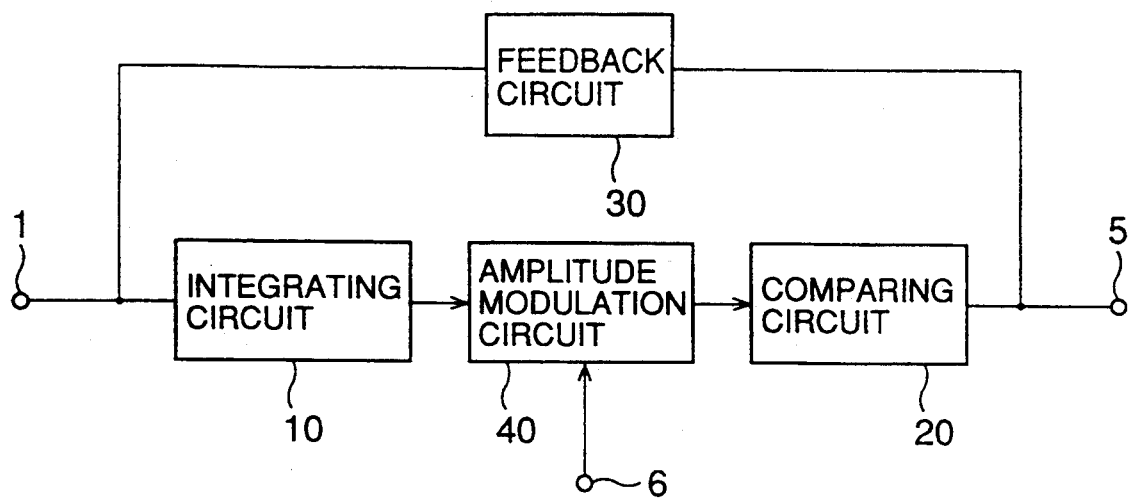
FIG. 18 is a block diagram showing an embodiment based upon a second aspect according to the present invention.

FIG. 18 shows a pulse width modulation circuit of another aspect of the present invention. In FIG. 18, the input terminal 1 is connected to an integrating circuit 10. The output of the integrating circuit 10 is supplied to a comparing circuit 20 via an amplitude modulation circuit 40. The output of the comparing circuit 20 is connected to an output terminal 5 and also fed-back to the input side of the integrating circuit 10 via a feedback circuit 30. Further, the dither signal is applied to the amplitude modulation circuit 40 through a dither signal input terminal 6. In this embodiment, the frequency correction signal as described in FIG. 15 may be supplied to the terminal 6.

Figure 19:
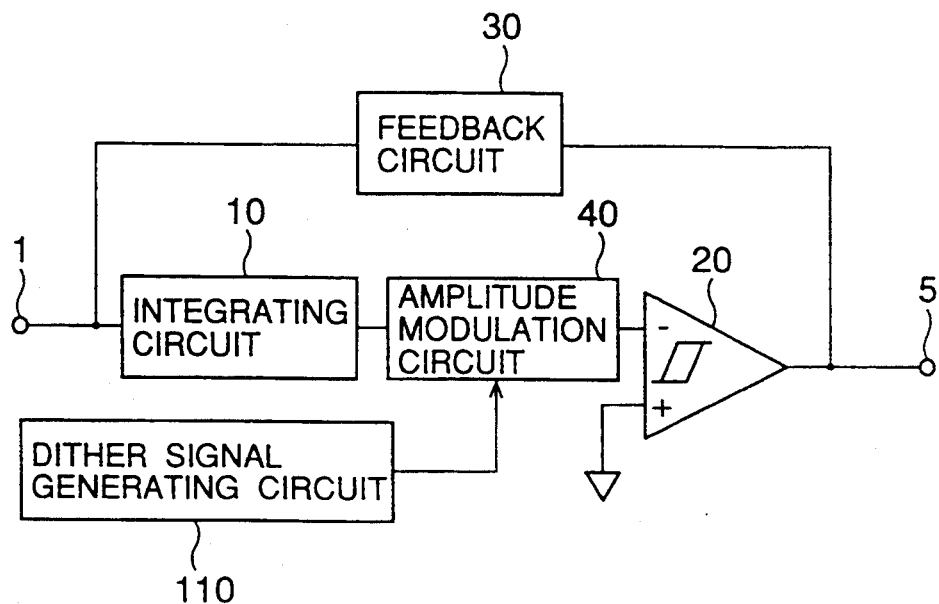
FIG. 19 is a block diagram showing a more practical circuit of that shown in FIG. 18.

FIG. 19 is a circuit similar to that shown in FIG. 18. The point different between the two circuits is that a dither signal which is applied to the amplitude modulation circuit 40 is generated by a dither signal generating circuit 110. The dither signal generating circuit 110 outputs a dither signal, and the amplitude modulation circuit 40 modulates the amplitude of the output signal of the integrating circuit 10 on the basis of the dither signal. Further, the comparing circuit 20 is an operational amplifier provided with hysteresis characteristics. The output signal of the amplitude modulation circuit 40 is supplied to the inversion input terminal of the comparing circuit 20. The output of the comparing circuit 40 is outputted through the output terminal 5 and further fed-back to the input side of the integrating circuit 10 through the feedback circuit 30.

Figure 20:
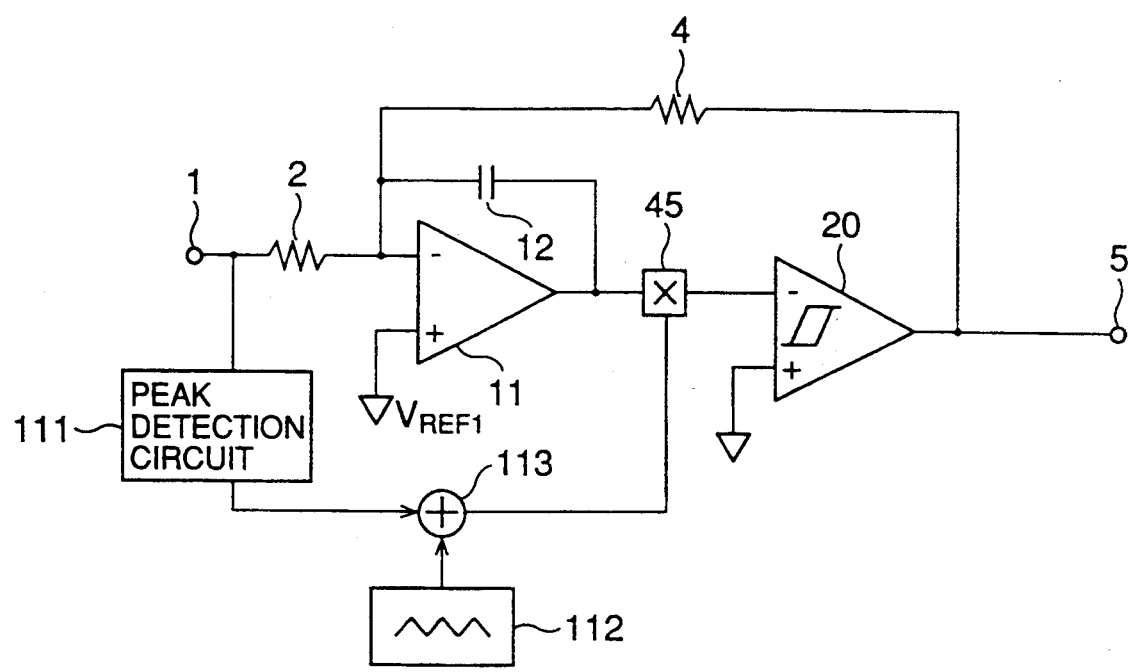
FIG. 20 is a block diagram showing a still more practical circuit of that shown in FIG. 19.

FIG. 20 is a more practical circuit of the circuit shown in FIG. 19. In FIG. 20, one end of an input resistor 2 is connected to the signal input terminal 1. The other end of the input resistor 2 is connected to an inversion input terminal (−) of an operational amplifier 11. This operational amplifier 11 and a capacitor 12 can constitute an integrating circuit. One end of the capacitor 12 is connected to the inversion input terminal of the operational amplifier 11, and the other terminal thereof is connected to an output terminal of the operational amplifier 11. A voltage supply (not shown) for supplying a reference voltage $V_{ref1}$ is connected to a non-inversion input terminal (+) of the operational amplifier 11. The output of the operational amplifier 11 is supplied to a multiplier circuit 45, and the output thereof is supplied to an inversion input terminal of an operational amplifier 20. The output of the operational amplifier 20 is outputted through an output terminal 5 and also fed-back to the inversion input terminal of the operational amplifier 11 of the integrating circuit via a feedback resistor 4.

The signal applied to the input terminal 1 is also applied to a peak detecting circuit 111. The output thereof is added to the output of a dither oscillating circuit 112 by an adder circuit 113. The output of the adder 113 is connected to an input terminal of the multiplier circuit 45. The multiplier circuit 45 modulates the amplitude of the output signal of the operational amplifier 11 on the basis of the output signal of the adder circuit 113.

The operation of this circuit shown in FIG. 20 will be described hereinbelow.

When no analog wave signal is applied to the input terminal 1, the potential change of the integrating capacitor 12 due to current flowing through the feedback resistor 4 is acquired by the comparing circuit 20. In other words, since the current flowing through the feedback circuit flows into the capacitor 12, the output potential of the integrating circuit 11 decreases. This operation continues until the output potential of the integrating circuit 11 drops below the reference potential. When the output potential of the integrating circuit 10 drops below the reference potential, since the capacitor 12 begins to discharge, the current direction of the feedback circuit is switched, so that the output potential of the integrating circuit 10 increases until this potential exceeds the reference potential. Thereafter, when the output potential of the integrating circuit 10 exceeds the reference potential, the capacitor 12 is returned to the charging status. As a result of the above-mentioned operation, it is possible to output a pulse signal having a constant duty factor from the comparing circuit 20. This pulse signal is used as a carrier signal.

When an analog signal is applied to the input terminal 1, the potential of the integrating capacitor element 12 is subjected to the influence of the amplitude of the input signal. In other words, when the potential at the input terminal 1 is lower than the reference potential, the decrease rate of the output potential of the integrating circuit 20 is low, but the increase rate thereof is high. Further when the potential at the input terminal 1 is higher than the reference potential, the decrease rate of the output potential of the integrating circuit 20 is high, but the increase rate thereof is low.

The above-mentioned operation will be described hereinbelow with reference to FIGS. 21A to 21D.

When the analog signal as shown in FIG. 21A is supplied to the input terminal 1, the output of the integrating circuit 11 becomes the wave as shown by a solid line in FIG. 21B. In this figure, it is shown that the level of the wave is limited by the level of the dashed line in which the gradient is different when the potential rises and when the potential falls. This dashed line denotes a limiting level obtained by adding the detected peak level of the input signal and the dither signal. Further, the amplitude of the output signal of the multiplier circuit 45 becomes the waveform having approximately constant amplitude shown in FIG. 21C.

Since the output of the multiplier circuit 45 is supplied to the comparing circuit 20, the signal is frequency modulated in accordance with the hysteresis characteristics of the comparing circuit 20, as shown in FIG. 21D. In this frequency modulated signal, the spectrum components of the fundamental and higher harmonics of the carrier signal are diffused.

As described above, since the output of the integrating circuit 20 is amplitude-modulated on the basis of the dither signal and input peak value, and the amplitude-modulated signal is applied to the comparing circuit 20 for frequency modulation, the spectrum components of the fundamental and higher harmonics of the modulated signal can be diffused, with the result that it is possible to suppress the unnecessary radiation. Further, since the peak levels of the spectrum components of the fundamental and higher harmonics can be lowered, it is possible to suppress the harmful influence due to the spectrum components of the fundamental and higher harmonics upon the output of the integrating circuit.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A pulse width modulation circuit, comprising:
  an input terminal for receiving an input signal;
  an integrating circuit for integrating the input signal applied to said input terminal with respect to time;
  a comparing circuit, provided at an output side of said integrating circuit, having first and second threshold values, said comparing circuit comparing a signal applied to said comparing circuit with the first and second threshold values;
  an output section connected to an output of said comparing circuit;
  a feedback circuit for feeding back the output of said comparing circuit to an input of said integrating circuit; and
  an amplitude modulation circuit provided in a loop including said integrating circuit and said comparing circuit, for implementing amplitude modulation to modulate a frequency of the output of said comparing circuit.

2. A pulse width modulation circuit, comprising:
  an input terminal for receiving an input signal;
  an integrating circuit for integrating the input signal applied to said input terminal with respect to time;
  a comparing circuit, provided at an output side of said integrating circuit, having first and second threshold values, said comparing circuit comparing a signal applied to said comparing circuit with the first and second threshold values;
  an output section connected to an output of said comparing circuit;
  a first feedback circuit for feeding back an output signal of said output section to an input of said integrating circuit;
  an amplitude modulation circuit for implementing amplitude modulation of the output of said comparing circuit; and
  a second feedback circuit for feeding back the output of said comparing circuit to an input of said amplitude modulation circuit, and the output of said amplitude modulation circuit to the input of said integrating circuit.

3. The pulse width modulation circuit as set forth in claim 2, wherein an amplitude-modulating dither signal is applied to said amplitude modulation circuit together with the output of said comparing circuit.

4. The pulse width modulation circuit as set forth in claim 3, wherein said amplitude modulation circuit has a dither signal input terminal to which a correction signal for maintaining frequency of pulse width modulated signal at a specific duty factor is supplied.

5. The pulse width modulation circuit as set forth in claim 4, wherein a circuit for generating the correction signal is connected to the dither signal input terminal.

6. The pulse width modulation circuit of claim 5, wherein said circuit for generating the correction signal comprises:
  a peak detecting circuit for detecting a peak value of the input signal;
  a plurality of comparators for comparing an output of said peak detecting circuit with different reference voltages;
  a plurality of switching amplifiers controlled according to outputs of said comparators, respectively; and
  an adder circuit for adding outputs of said switching amplifiers to each other.

7. The pulse width modulation circuit as set forth in claim 2, wherein said amplitude modulation circuit is a differential amplifier circuit composed of a pair of transistors, a dither signal being supplied to a common emitters of said two transistors.

8. The pulse width modulation circuit as set forth in claim 2, wherein said output signal is composed of first and second output terminals for outputting signals having opposite polarities.

9. The pulse width modulation circuit as set forth in claim 8, further comprising:

an inverter, connected to an output of the comparing circuit, for inverting the output of the comparing circuit; and a buffer, connected to the output of the comparing circuit, for maintaining a polarity of the output of the comparing circuit.

10. The pulse width modulation circuit as set forth in claim 9, wherein:

the first output terminal is connected to an inversion input terminal of an operational amplifier which constitutes said integrating circuit via the first feedback circuit which includes a first feedback resistor; and the second output terminal is connected to a non-inversion input terminal of the operational amplifier via a second feedback resistor.

11. The pulse width modulation circuit as set forth in claim 5, wherein a low impedance load is connected between the first and second output terminals via first and second inductances of a low-pass filter.

12. The pulse width modulation circuit as set forth in claim 11, wherein the low impedance load is a speaker.

13. The pulse width modulation circuit as set forth in claim 2, wherein said amplitude modulation circuit comprises:

a first switch circuit which inputs the output signal of the comparing circuit at a first input thereof, and which inputs a dither signal at a second input thereof, said first switch circuit outputting the output signal of the comparing circuit which is within a level of the dither signal;

a second switch circuit which inputs an inverted output signal of the comparing circuit at a first input thereof and which inputs an inverted dither signal at a second input thereof, said second switch circuit outputting the inverted output signal of the comparing circuit which is within a level of the inverted dither signal;

a first multiplier for multiplying the output of said first switch circuit by the input signal;

a second multiplier for multiplying the output of said second switch circuit by the inverted input signal; and a circuit for superposing the outputs of said first and second multipliers upon the input of said integrating circuit.

14. The pulse width modulation circuit as set forth in claim 2, wherein said amplitude modulation circuit comprises:

first and second differential amplifiers for comparing the output of the comparing circuit with respective predetermined reference voltages;

a current mirror circuit for flowing current through common emitters of said differential amplifiers according to a dither signal;

an inversion amplifier for inverting an output of said second differential amplifier;

a first multiplier for multiplying an output of said first differential amplifier by the input signal;

a second multiplier for multiplying an output of said inversion amplifier by the input signal which has been inverted; and a circuit for superposing the outputs of said first and second differential amplifiers upon the input of said integrating circuit.

15. The pulse width modulation circuit as set forth in claim 2, wherein a power driver circuit is connected between said comparing circuit and said output section, a low impedance load being connected to said output terminal via a low-pass filter.

16. The pulse width modulation circuit as set forth in claim 15, wherein the low impedance load is a speaker.

17. A pulse width modulation circuit, comprising:

an input terminal;

an integrating circuit for integrating an input signal applied to said input terminal with respect to time;

an amplitude modulation circuit, connected to an output of the integrating circuit, for modulating a frequency of a signal output by the integrating circuit;

a comparing circuit, connected to an output of the amplitude modulation, for comparing the output of the amplitude modulation circuit with first and second values;

an output terminal, connected to an output of the comparing circuit; and a feedback circuit, which connects the output terminal to an input of the integrating circuit.

18. The pulse width modulation circuit of claim 17, further comprising;

a modulated wave generating circuit for controlling operation of said amplitude modulation circuit.

19. The pulse width modulation circuit of claim 18, wherein said modulated wave generating circuit comprises:

a peak detecting circuit for detecting a peak value of the input signal;

an adder for adding an output of said peak detecting circuit to the dither signal; and said amplitude modulation circuit being a multiplier for multiplying an output of said adder by an output of said integrating circuit.

* * * * *